United States Patent
Sato et al.

(10) Patent No.: US 7,935,585 B2
(45) Date of Patent: May 3, 2011

(54) METHOD OF FABRICATING SEMICONDUCTOR DEVICE AND METHOD FOR FABRICATING ELECTRONIC DEVICE

(75) Inventors: Mitsuru Sato, Suwa (JP); Sumio Utsunomiya, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 145 days.

(21) Appl. No.: 11/905,961

(22) Filed: Oct. 5, 2007

(65) Prior Publication Data
US 2008/0090388 A1  Apr. 17, 2008

(30) Foreign Application Priority Data
Oct. 11, 2006  (JP) .................................. 2006-277932

(51) Int. Cl.
*H01L 21/84* (2006.01)
(52) U.S. Cl. .................. 438/166; 257/E21.561
(58) Field of Classification Search .......... 438/151–166; 257/E21.561
See application file for complete search history.

(56) References Cited

U.S. PATENT DOCUMENTS

| | | | |
|---|---|---|---|
| 3,272,591 A | 9/1966 | Rudness et al. | |
| 3,652,431 A | 3/1972 | Reynolds | |
| 3,870,472 A | 3/1975 | Adamski et al. | |
| 3,876,382 A | 4/1975 | Falckenberg | |
| 3,917,459 A | 11/1975 | Falckenberg et al. | |
| 4,466,179 A * | 8/1984 | Kasten | 438/488 |
| 4,494,300 A * | 1/1985 | Schwuttke et al. | 438/155 |
| 4,682,206 A * | 7/1987 | Tsuya et al. | 257/64 |
| 5,314,847 A | 5/1994 | Watanabe et al. | |
| 5,786,277 A | 7/1998 | Yamamoto | |
| 6,000,789 A | 12/1999 | Takagi et al. | |
| 6,047,552 A | 4/2000 | Gross et al. | |
| 6,130,397 A | 10/2000 | Arai | |
| 6,187,616 B1 | 2/2001 | Gyoda | |
| 6,264,316 B1 | 7/2001 | Chino | |
| 6,271,066 B1 * | 8/2001 | Yamazaki et al. | 438/166 |
| 6,505,484 B1 | 1/2003 | Fujiwara et al. | |
| 6,984,267 B2 | 1/2006 | Irino et al. | |
| 7,514,306 B2 | 4/2009 | Utsunomiya | |
| 2002/0153360 A1 | 10/2002 | Yamazaki et al. | |
| 2004/0155244 A1 | 8/2004 | Kawata et al. | |
| 2005/0019997 A1 | 1/2005 | Kusumoto et al. | |
| 2005/0217799 A1 | 10/2005 | O'Meara et al. | |
| 2006/0134347 A1 | 6/2006 | Chiruvolu et al. | |
| 2006/0223328 A1 | 10/2006 | Utsunomiya et al. | |
| 2007/0051135 A1 | 3/2007 | Machida et al. | |
| 2007/0111450 A1 | 5/2007 | Sato et al. | |

(Continued)

FOREIGN PATENT DOCUMENTS

CN  1161569 A  10/1997

(Continued)

OTHER PUBLICATIONS

S. Higashi et al., "Crystallization of Si Thin Film Using Thermal Plasma Jet and Its Application to Thin-Film Transistor Fabrication", AM-LCD '04 Technical Digest Papers, p. 179.

*Primary Examiner* — Richard A. Booth
(74) *Attorney, Agent, or Firm* — Oliff & Berridge, PLC

(57) ABSTRACT

A method for fabricating a semiconductor device, comprising: forming a semiconductor film on a substrate; and recrystallizing the semiconductor film using as a heat source flame of a gas burner that uses hydrogen and oxygen gas mixture as a fuel.

13 Claims, 16 Drawing Sheets

U.S. PATENT DOCUMENTS

| | | |
|---|---|---|
| 2007/0202319 A1 | 8/2007 | Bryan et al. |
| 2007/0232034 A1 | 10/2007 | Utsunomiya |
| 2008/0087213 A1 | 4/2008 | Sato et al. |

FOREIGN PATENT DOCUMENTS

| | | |
|---|---|---|
| CN | 1263636 A | 8/2000 |
| CN | 1518129 A | 8/2004 |
| JP | A-56-137643 | 10/1981 |
| JP | A-4-284630 | 10/1992 |
| JP | A-6-13407 | 1/1994 |
| JP | A-6-69127 | 3/1994 |
| JP | A-6-302511 | 10/1994 |
| JP | 8-8255 | 1/1996 |
| JP | A-9-156916 | 6/1997 |
| JP | A-9-293687 | 11/1997 |
| JP | A-10-6523 | 1/1998 |
| JP | A-11-135492 | 5/1999 |
| JP | A-11-145148 | 5/1999 |
| JP | A-2003-130315 | 5/2003 |
| JP | A 2003-197618 | 7/2003 |
| KR | 94-010509 | 10/1994 |

\* cited by examiner

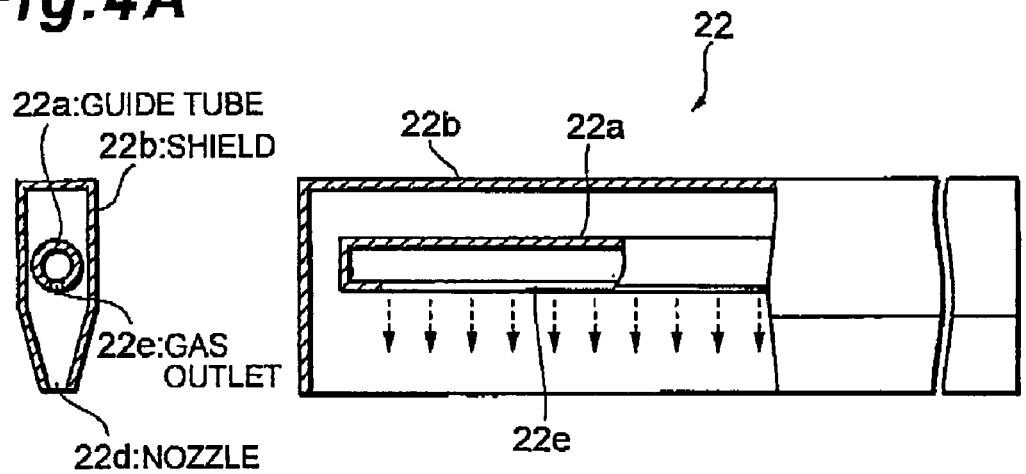
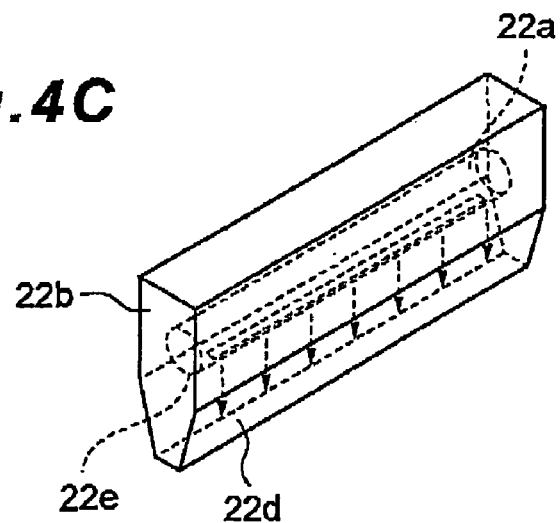

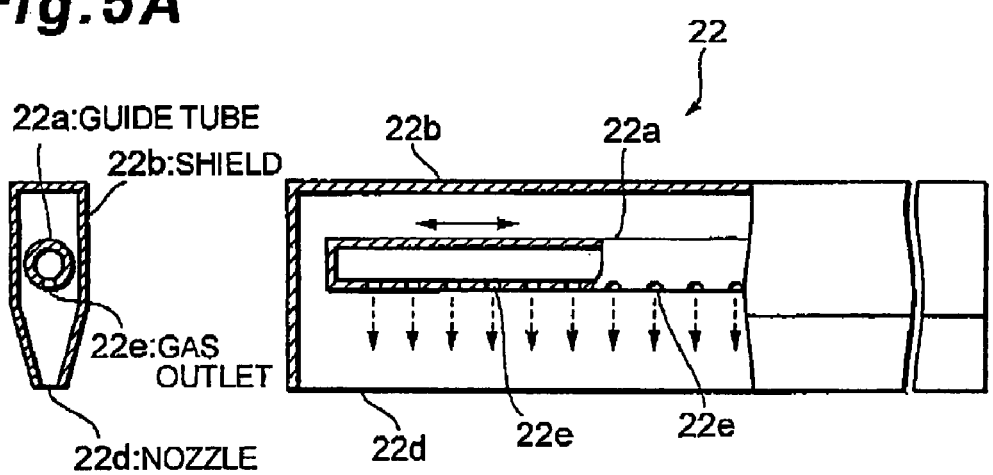
Fig.5A
- 22a: GUIDE TUBE
- 22b: SHIELD
- 22e: GAS OUTLET
- 22d: NOZZLE
Fig.5B
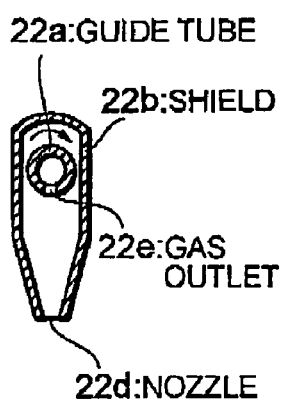
Fig.6A
- 22a: GUIDE TUBE
- 22b: SHIELD
- 22e: GAS OUTLET
- 22d: NOZZLE
Fig.6B

*Fig.7A*  *Fig.7B*
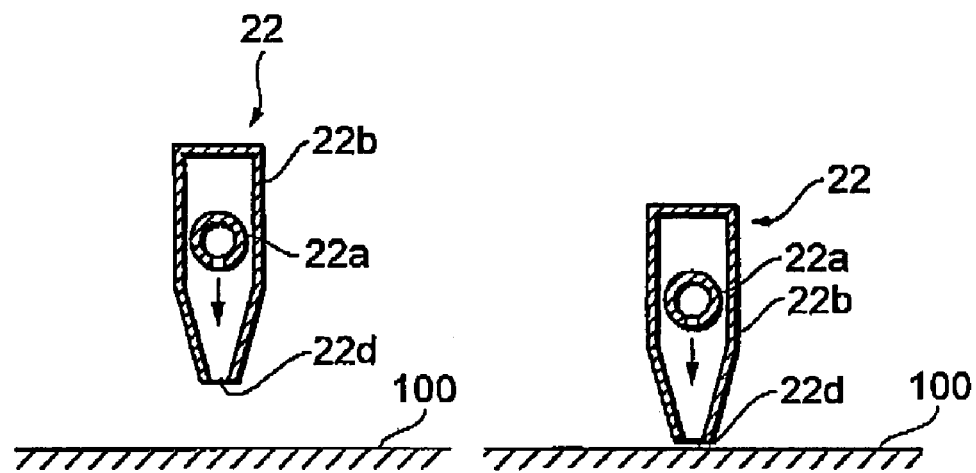
*Fig.8A*  *Fig.8B*
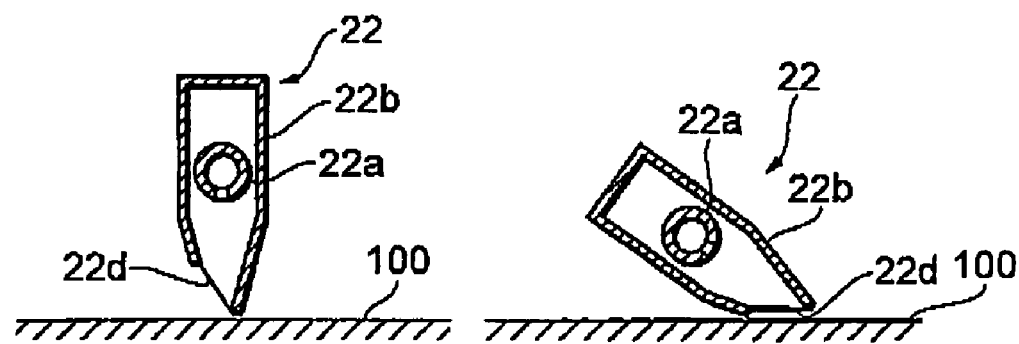

Fig.9A  Fig.9B
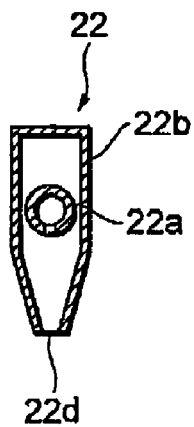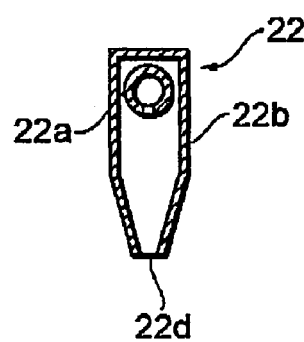
Fig.10
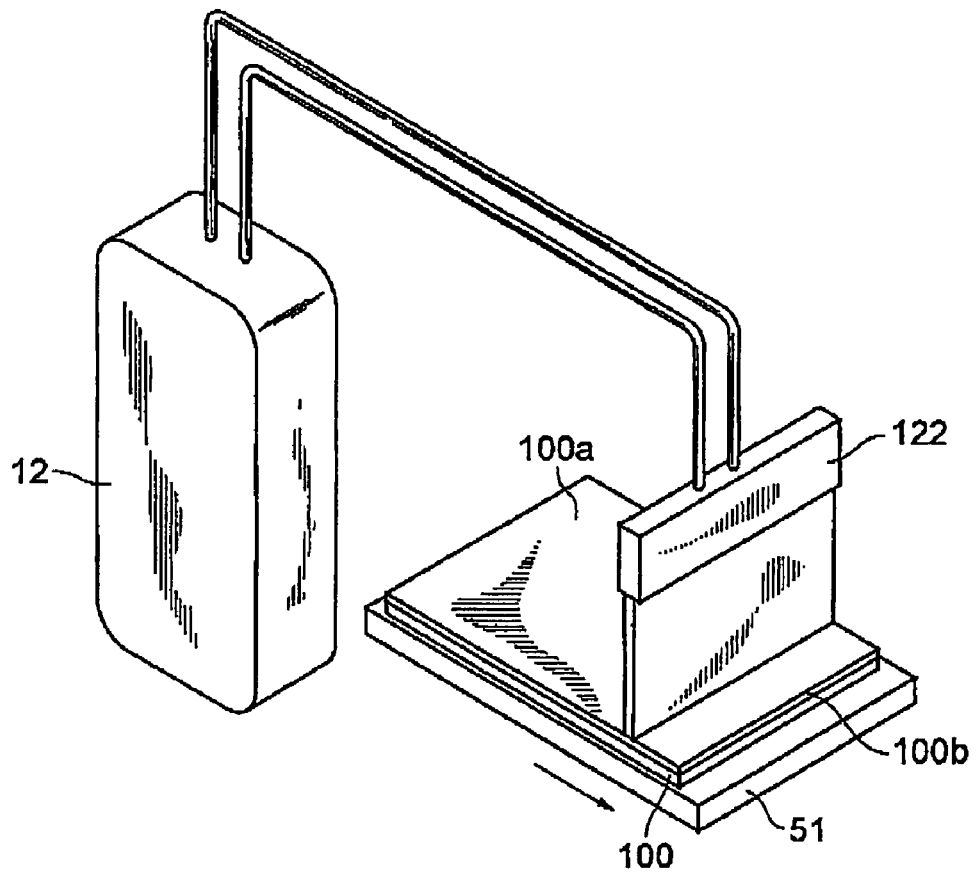

Fig.19

| SAMPLE | Gap [mm] | SCANNING SPEED [mm/s] | MAX TEMP [°C] | Si FILM THICKNESS [μm] | SiO$_2$ FILM THICKNESS [μm] | RECRYSTALLIZATION RATE (Ratio) | HALF WIDTH FWHM /cm$^{-1}$ | PEAK CENTER Peak Center /cm$^{-1}$ |
|---|---|---|---|---|---|---|---|---|
| A | 50 | 62 | 713 | 0.051 | 0.004 | 0.87 | 7.7 | 514.8 |
| B | 50 | 50 | 722 | 0.051 | 0.004 | 0.88 | 7.3 | 515 |
| C | 30 | 98 | 708 | 0.0505 | 0.0035 | 0.87 | 7.6 | 514.8 |
| D | 30 | 65 | 756 | 0.051 | 0.004 | 0.89 | 7.5 | 514.8 |
| E | 30 | 38 | 889 | 0.04 | 0.009 | 0.94 | 5.9 | 516.4 |

METHOD OF FABRICATING SEMICONDUCTOR DEVICE AND METHOD FOR FABRICATING ELECTRONIC DEVICE

CROSS-REFERENCES TO RELATED APPLICATIONS

The entire disclosure of Japanese Patent Application No. 2006-277932, filed on Oct. 11, 2006 is expressly incorporated by reference herein.

BACKGROUND

1. Technical Field

The present invention relates to fabrication of a semiconductor device, and to a thermal process that achieves a cost reduction in semiconductor fabrication processing and enables to produce consistent and high quality transistor elements.

2. Related Art

Crystallization methods designed to recrystallize silicon formed as a film on a substrate using a CVD (chemical vapor deposition) method include solid phase recrystallization utilizing a process of high temperature heating at 800 to 1,000° C., laser annealing methods utilizing excimer laser emission, thermal plasma jet methods utilizing thermal plasma as a heat source and the like (JP-A-11-145148, Crystallization of Si Thin Film Using Thermal Plasma Jet and Its Application to Thin-Film Transistor Fabrication, S. Higashi, AM-LCD '04 Technical Digest Papers, p. 179).

SUMMARY

The present inventors have conducted experiments with the solid phase recrystallization method using the previously mentioned heating process (RTA: Rapid thermal Annealing) in which a substrate for forming a silicon film was exposed to a high temperature of 800 to 1,000° C., and the thermal load on the substrate was increased, as will be described in detail later. However, laser annealing reduced the thermal load on the substrate since the silicon film could be locally crystallized at high temperature in a short time. Thus, laser annealing can also be referred to as a low temperature crystallization process (LTPS). Melt recrystallization is the mainstream in laser annealing. There is, therefore, large dispersion of crystal diameter and large dispersion of element characteristics, as shall be described later.

Thus, there were advantages and disadvantages in conventional RTA and laser annealing methods insofar as it was difficult to reduce dispersion of element characteristics, and difficult to form a high performance semiconductor device while reducing the thermal load on the substrate.

Furthermore, fabricating the device itself was expensive and the fabricating running costs were increased using conventional RTA and laser annealing methods. Increasing the scale of device was difficult, and one-time processing of large area substrates was also difficult.

Therefore, an advantage of some aspects of the present invention is to provide a method for fabricating a semiconductor device capable of reducing the thermal load on the substrate. A further advantage of the present invention is to provide a method for fabricating a semiconductor device capable of improving semiconductor element characteristics. A still further advantage of the present invention is to reduce the cost of fabricating a semiconductor device.

(1) The method for fabricating the semiconductor device of the present invention has a process for forming a semiconductor film on a substrate, and a process for recrystallizing the semiconductor film using, as a heat source, flame of a gas burner that uses a gas mixture of hydrogen and oxygen as a fuel.

According to this method, the thermal load on the substrate can be reduced during recrystallization of the semiconductor film. Therefore, warping and breaking of the substrate can be reduced, and characteristics of the semiconductor element can be improved. Large area substrate processing is also possible, fabricating throughput of semiconductor devices is improved, and costs can be lowered. Moreover, the cost of fabricating a semiconductor device can be reduced compared to conventional RTA and laser processing because the cost of the fabricating apparatus and the attendant running cost can be reduced.

The semiconductor film may be, for example, a silicon film. According to this method, silicon recrystallization can be performed.

Recrystallization may be accomplished, for example, by solid phase recrystallization. This method reduces dispersion of formed crystal particles by recrystallization, thus improving characteristics of the semiconductor device.

Recrystallization is desirably accomplished by causing the flame of a gas burner to relatively scan a substrate. This method allows easy adjustment of the thermal processing temperature (substrate surface temperature) by adjusting the scanning speed. Large area substrate processing is also possible, fabricating throughput of semiconductor devices is improved, and costs can be lowered.

Recrystallization is desirably accomplished by adjusting the substrate temperature by adjusting the scanning speed of the gas burner or distance between the flame and the substrate. According to this configuration, the adjustment of the substrate temperature is easily accomplished.

It is desirable that the substrate is a glass substrate and the semiconductor film is a silicon film, and that the flame of the gas burner scans the surface of the substrate at a scanning speed of 0.01 m/s or greater but not more than 1.5 m/s. The scanning speed is more desirably 0.02 m/s or greater but not more than 0.5 m/s. According to this method, the necessary thermal processing temperature on the surface of the substrate is ensured while reducing the thermal load on the glass substrate (entire body). Furthermore, the thermal processing temperature can be set in a range for starting solid phase recrystallization, and dispersion of crystal particles formed by recrystallization can be reduced.

It is desirable that the substrate is a glass substrate and the semiconductor film is a silicon film, and that the thermal diffusion length on the glass substrate is 0.8 to 0.04 mm in the process of recrystallization. The thermal diffusion length is more desirably 0.5 to 0.08 mm. According to this method, the necessary thermal processing temperature on the surface of the substrate is ensured while reducing the thermal load on the glass substrate (entire body). Furthermore, the thermal processing temperature can be set in a range for starting solid phase recrystallization, and dispersion of crystal particles formed by recrystallization can be reduced.

It is desirable that the substrate is a glass substrate and the semiconductor film is a silicon film, and that the thermal diffusion length on the glass substrate is 75% or less of the thickness of the glass substrate in the process of recrystallization. The thermal diffusion length is more desirably 40% or less of the thickness of the glass substrate. According to this method, the necessary thermal processing temperature on the surface of the substrate is ensured while reducing the thermal load on the glass substrate (entire body). Furthermore, the thermal processing temperature can be set in a range for starting solid phase recrystallization, and dispersion of crystal particles formed by recrystallization can be reduced.

It is desirable that the substrate is a glass substrate and the semiconductor film is a silicon film, and that the surface temperature of the glass substrate is 670 to 750° C. in the process of recrystallization. According to this method, the necessary thermal processing temperature on the surface of the substrate is ensured while reducing the thermal load on the glass substrate (entire body). Furthermore, the thermal processing temperature can be set in a range for starting solid phase recrystallization, and dispersion of crystal particles formed by recrystallization can be reduced.

(2) The method for fabricating an electronic device of the present invention has a method for fabricating a semiconductor device and a method for fabricating an electronic device provided with this semiconductor device. Although the electronic device may be a general device having fixed functions and provided with the semiconductor device of the present invention, the present invention is not limited to this configuration and includes general computer devices provided with this semiconductor device, and devices that require a semiconductor device such as portable telephones, PHS, PDA, electronic notebooks, IC cards and the like.

BRIEF DESCRIPTION OF THE DRAWINGS

FIG. 4 shows a first structural example of the gas burner of the semiconductor fabricating apparatus;

FIG. 5 shows a second structural example of the gas burner of the semiconductor fabricating apparatus;

FIG. 6 shows a third structural example of the gas burner of the semiconductor fabricating apparatus;

FIG. 7 shows the relationship between the height of the nozzle and the gas outflow pressure;

FIG. 8 shows the relationship between the shape and angle of the nozzle and the gas outflow pressure;

FIG. 9 shows the relationship between the gas outflow pressure and the distance between the nozzle and the guide tube;

FIG. 10 is a perspective view showing a structural example of the hydrogen flame process device (semiconductor fabricating apparatus);

FIG. 19 shows the silicon film thickness after crystal regrowth, the silicon oxide film thickness, and crystallization rates for samples A through E;

DESCRIPTION OF EXEMPLARY EMBODIMENTS

1) Semiconductor Fabricating Apparatus

A semiconductor fabricating apparatus used to fabricate the semiconductor device of the present embodiment is described hereinafter with reference to FIGS. 1 through 9.

Figure 1:
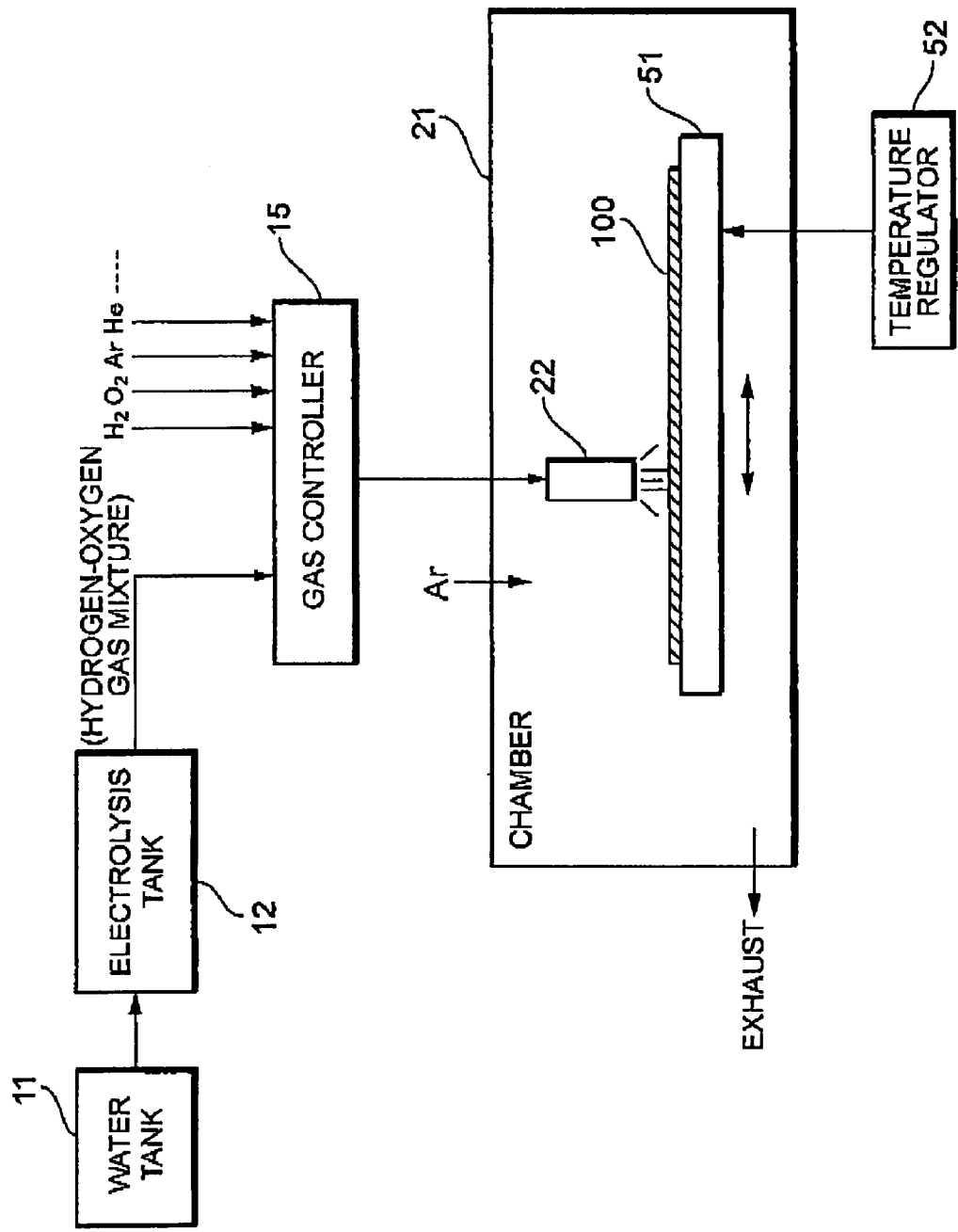
FIG. 1 shows a structural example of the semiconductor fabricating apparatus used to fabricate the semiconductor device of the embodiment.

FIG. 1 shows an example of the structure of the semiconductor fabricating apparatus used for fabricating the semiconductor device of the present embodiment. In FIG. 1, purified water is stored in a water tank 11, and this water is supplied to an electrolysis tank (electrolysis device) 12. The water is electrolyzed by the electrolysis tank 12 and hydrogen gas and oxygen gas are released therefrom. The released hydrogen gas and oxygen gas are supplied to a gas controller 15. The gas controller 15 is configured by a computer system, regulator valve, and various types of sensors, and the gas controller 15 adjusts the amount, pressure and ratio of the hydrogen gas and oxygen gas (gas mixture) supplied to a downstream gas burner 22 in accordance with a preset program.

The gas controller 15 conducts the hydrogen gas ($H_2$) and oxygen gas ($O_2$) supplied from a gas storage tank which is not shown in the figure to form the previously mentioned gas mixture, which is then supplied to the gas burner 22. Thus, mixture ratio of the hydrogen gas and the oxygen gas of the gas mixture is shifted from the stoichiometric composition ratio of water ($H_2O$) ($H_2:O_2=2$ mol:1 mol), to obtain a gas mixture of excess hydrogen (hydrogen rich) or excess oxygen (oxygen rich).

Furthermore, the gas controller 15 is supplied gas from a storage tank which is not shown in the figure so as to introduce inactive gases such as argon (Ar), helium (He), nitrogen ($N_2$) and the like into the has mixture. Thus, controlling the flame condition and flame temperature (combustion temperature) of the gas burner 22.

The water tank 11, electrolysis tank 12, and gas controller 15 configure a fuel (source material) supply unit.

A chamber (processing compartment) 21 is disposed in a closed space downstream from the gas controller 15. Disposed within this chamber 21 is a gas burner 22 for generating the flame of the heating process, and a stage 51 which is movable relative to the burner 22 and on which is installed a processing object substrate (semiconductor substrate, glass substrate and the like) 100.

The atmosphere within the chamber 21 is not limited, and may be set, for example, at an internal pressure ranging from approximately atmospheric pressure to 0.5 MPa, and the internal temperature may be set in a range from approximately ambient temperature to 100° C. The previously mentioned argon or other inert gas may be introduced into the chamber 21 to maintain a desired gas pressure within the chamber 21.

The stage 51 is provided with a mechanism for moving the dais on which the substrate is installed at a fixed speed to prevent particles. To prevent heat shock of the substrate 100 caused by a rapid temperature differential, a mechanism is provided to heat (preheat) and cool the mounting dais of the substrate 100, and temperature control is performed by an external temperature controller 52. An electric heating device is used for heating and a cooling device which employs coolant gas and coolant liquid is used for cooling.

Figure 2:
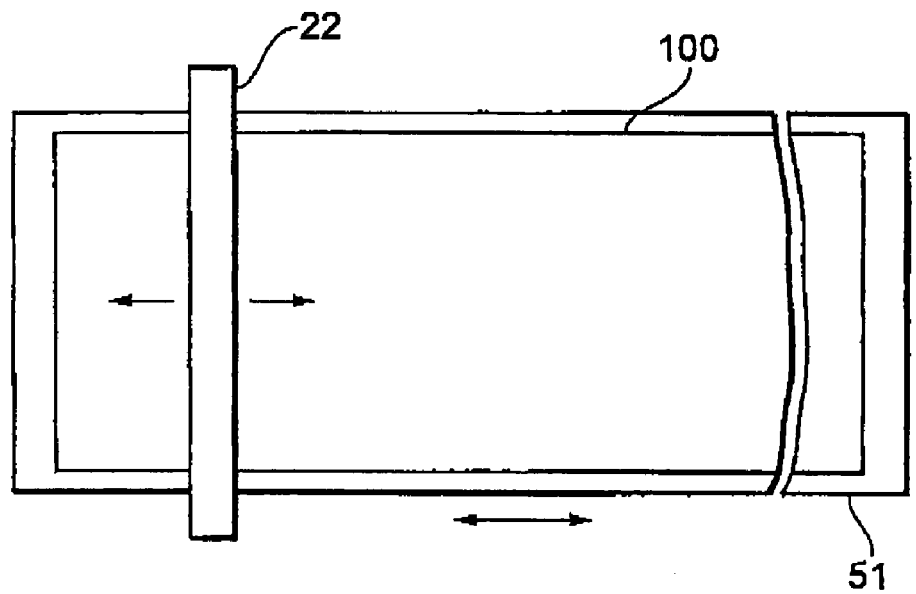
FIG. 2 is a top view showing a structural example of the gas burner of the semiconductor fabricating apparatus.

FIG. 2 is a top view showing an example of the gas burner structure of the semiconductor fabricating apparatus. As shown in FIG. 2, the gas burner 22 of the semiconductor fabricating apparatus of FIG. 1 is configured by a long member which is larger than the width of the stage 51 (vertical direction in the figure), and is capable of providing flame of which width is larger than the width of the stage 51. The gas burner 22 is configured so as to scan the substrate 100 by moving either the stage 51, or the gas burner 22, in a direction perpendicular to the lengthwise direction of the gas burner 22 (arrow direction in the figure).

Figure 3:
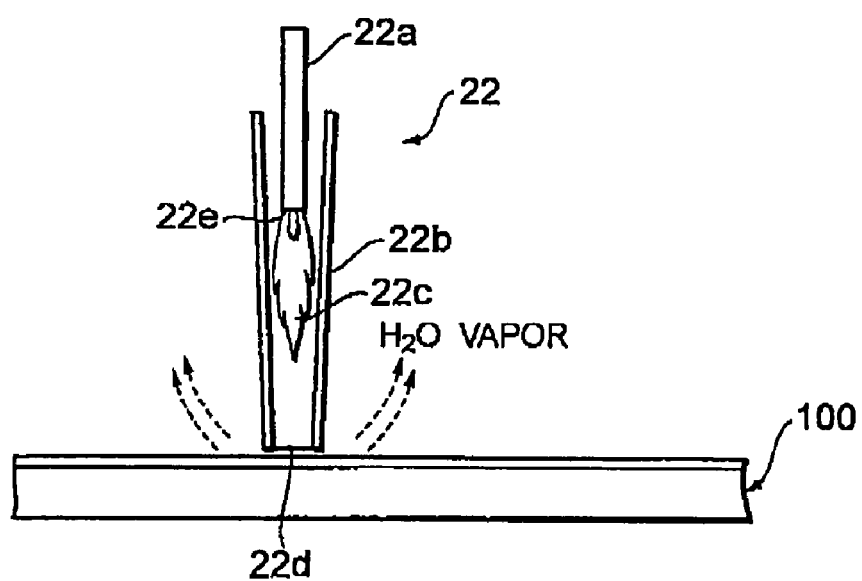
FIG. 3 is a cross section view showing a structural example of the gas burner of the semiconductor fabricating apparatus.

FIG. 3 is a cross section view showing an example of the gas burner structure of the semiconductor fabricating apparatus. As shown in FIG. 3, the gas burner 22 is configured by a guide tube 22a provided with a gas outlet for guiding the gas mixture to the combustion compartment, a shield 22b which circumscribes the guide tube 22a, a combustion compartment 22c for combusting the gas mixture and circumscribed by the shield 22b, nozzle 22d which forms an outlet to emit the combusted gas from the shield 22b, and gas mixture flow outlet 22e provided on the guide tube 22a.

When the gap (distance) between the nozzle 22d and the substrate 100 is set wide, the pressure is reduced as the combusted gas is released from the nozzle. When the gap between the nozzle 22d and the substrate 100 is set narrow (constructed), the pressure is increased since the combustion gas pressure reduction is suppressed. Therefore, the gas pressure can be adjusted by adjusting this gap. Water vapor annealing, hydrogen annealing, oxygen annealing and the like can be promoted by increasing the pressure. Each type of annealing is selectable by the setting of the gas mixture. The figure shows the emission of water valor ($H_2O$ vapor).

The shape of the flame (flame length) of the combustion compartment 22c of the gas burner 22 can be linear (long flame), and a plurality of torches by configuring the gas mixture outlet 22e as a line or as a plurality. The temperature profile near the gas burner 22 is desirably set so as to be rectangular in the flame scanning direction via the design of the nozzle 22d of the shield 22b and the outlet 22e.

FIG. 4 shows a first structural example of the gas burner of the semiconductor fabricating apparatus. FIG. 4A is a cross section view of the gas burner 22 in the foreground direction, FIG. 4B is a partial cross section view of the gas burner 22 in the length direction, and FIG. 4C is a perspective view the gas burner schematics. In these figures, parts in common with FIG. 3 are designated by like reference numbers.

In this example, the shield 22b is configured so as to circumscribe the guide tube 22a. The lower part of the shield 22b becomes the nozzle 22d, and the gas flow outlet 22e is provided so as to be linear (slot) below the guide tube 22a (nozzle 22d side). The width of the orifice may change according to the location to achieve the same outflow at each position pf the linear gas outlet 22e.

FIG. 5 shows a second structural example of the gas burner of the semiconductor fabricating apparatus. Another structural example of the gas burner 22 is shown. FIG. 5A is a cross section view of the gas burner 22 in the foreground direction, and FIG. 5B is a partial cross section view of the gas burner 22 in the length direction. In both figures, parts in common with FIG. 3 are designated by like reference numbers.

In this example, the shield 22b is configured so as to circumscribe the guide tube 22a. The lower part of the shield 22b becomes the nozzle 22d, and a plurality of gas flow outlets 22e are provided at equal spacing at the lower part of the guide tube 22a (nozzle 22d side). In this configuration, the combustion chamber gas density is uniform, and the guide tube 22a is suitably movable, for example, in a lateral direction in the figure in order to make a uniform amount of gas flow from the nozzle 22d to the outside. With the guide tube 22a being fixed, the distance of the gas outlet 22e may change as needed according to the location to achieve the same outflow at each position of the gas outlet 22e.

FIG. 6 shows a third structural example of the gas burner of the semiconductor fabricating apparatus. FIG. 6A is a cross section view of the gas burner 22 in the foreground direction, and FIG. 6B is a partial cross section view of the gas burner 22 in the lengthwise direction. In both figures, parts in common with FIG. 3 are designated by like reference numbers.

In this example, the shield 22b is configured so as to circumscribe the guide tube 22a. The lower part of the shield 22b becomes the nozzle 22d, and a plurality of gas flow outlets 22e are provided at equal spacing in a spiral shape on the side surface of the guide tube 22a. In this configuration, the combustion chamber gas density is uniform, and the guide tube 22a is rotatable as indicated by the arrow in the figure in order to make a uniform amount of gas flow from the nozzle 22d to the outside.

FIG. 7 shows the relationship between the height of the nozzle and the gas outflow pressure. As shown in FIG. 7A, the outflow combustion gas pressure can be reduced by distancing the nozzle 22d from the surface of the substrate 100. As shown in FIG. 7B, the outflow combustion gas pressure can be increased by advancing the nozzle 22d to the surface of the substrate 100.

FIG. 8 shows the relationship between the shape and angle of the nozzle and the gas outflow pressure. As shown in FIG. 8, the gas outflow pressure can be adjusted by adjusting the orientation and shape of the nozzle 22d (adjusting the shape of the outlet and the angle relative to the substrate). In this example, the outlet shape of the nozzle 22d is open on one side, as shown in FIG. 8A. Therefore, the combustion gas outflow pressure can be reduced when the gas burner 22 assumes an upright position. As shown in FIG. 8B, combustion gas outflow pressure can be increased when the gas burner 22 is rotated or inclined and the outlet of the nozzle 22d approaches the surface of the substrate 100.

FIG. 9 shows the relationship between the gas outflow pressure and the distance between the nozzle and the guide tube. As shown in FIG. 9, the temperature of the combustion gas flowing from the nozzle 22d is adjustable by varying the relative positional relationship between the guide tube 22a and the shield 22b. For example, the guide tube 22a may be configured to be advanceable and retractable toward the nozzle 22d within the shield 22b, so as to move the combustion compartment 22c and change the distance between the heat source and the nozzle 22d. The distance between the heat source and the substrate may also be adjustable.

Therefore, the combustion gas flowing from the nozzle 22d has a relatively high temperature when the guide tube 22a is brought relatively near the nozzle 22d, as shown in FIG. 9A. Furthermore, the combustion gas flowing from the nozzle 22d has a relatively low temperature when the guide tube 22a is relatively distanced from the nozzle 22d, as shown in FIG. 9B.

Such a configuration is advantageous since the temperature of the outflow combustion gas is adjustable without changing the gap between the gas burner 22 and the substrate 100. The substrate temperature may of course also be adjusted by changing the gap between the gas burner 22 and the substrate 100. The gas temperature may of course also be adjusted by changing the gap between the gas burner 22 and the substrate 100 and adjusting the relative positional relationship between the guide tube 22a and the shield 22b. The substrate temperature may also be adjusted by changing the scanning speed of the gas burner 22 relative to the substrate.

The gas burner configurations shown in FIGS. 4 through 9 may be suitably combined.

The configuration shown in FIG. 7 and the configuration shown in FIG. 9 may be combined, for example. The temperature of the substrate 100 (for example, the surface temperature) can be adjusted by making the gap adjustable between the nozzle 22d and the substrate 100 so as to have the entirety of the gas burner 22 shown in FIG. 7 approach or be distanced from the substrate 100. Furthermore, the temperature of the substrate 100 can be finely adjusted by advancing or retracting the guide tube 22a within the gas burner 22 toward the nozzle 22d, as shown in FIG. 9. Therefore, the temperature of the substrate 100 can be more easily set at a target thermal processing temperature.

The configurations shown in FIGS. 7 and 8 may also be combined. The surface temperature of the substrate 100 and flame pressure can be adjusted by making the gap adjustable between the nozzle 22d and the substrate 100 so as to have the entirety of the gas burner 22 approach or retract from the substrate 100 (refer to FIG. 7). The surface temperature of the substrate 100 and the flame pressure may then be adjusted by adjusting the orientation of the entirety of the gas burner 22 relative to the substrate 100 (refer to FIG. 8).

The configurations shown in FIGS. 7, 8, and 9 may also be combined. The temperature of the substrate 100 and flame pressure can be coarsely adjusted by making the gap adjustable between the nozzle 22d and the substrate 100 so as to have the entirety of the gas burner 22 approach or retract from the substrate 100 (refer to FIG. 7). The flame pressure at the surface temperature of the substrate 100 may then be adjusted by adjusting the orientation of the entirety of the gas burner 22 relative to the substrate 100 (refer to FIG. 8). The surface temperature of the substrate 100 may then be finely adjusted by advancing or retracting the guide tube 22a within the gas burner 22 toward the nozzle 22d (refer to FIG. 9). More accurate thermal processing is possible by this configuration.

Although not shown in the figures, the orifice (outlet, diaphragm) of the nozzle 22d may also be modifiable so as to widen and narrow in the scanning direction of the gas burner 22 by having the shield plate 22b of the gas burner 22 a movable type. Thus, the exposure time of the processed part of the substrate 100 in the scanning direction of the gas burner 22, the temperature profile of the thermal process of the substrate 100, the temperature of the thermal process, and the flame pressure and the like are adjustable.

In the above described semiconductor fabricating apparatus, the thermal process can be performed on a large surface area substrate such as window glass since a long gas burner is provided which is capable of transecting the substrate. Furthermore, obtaining the gas fuel is simple and running costs are inexpensive since the hydrogen and oxygen used as fuel can be obtained by electrolyzing water.

Although the gas burner 22 is provided with a shield 22b in the above described semiconductor fabricating apparatus, processing may also be performed with the gas burner 22 exposed to the outside air without using the shield 22b, that is with a direct flame radiating from the guide tube 22a. Although the semiconductor fabricating apparatus above has been described in terms of a combustion gas discharged from the shield 22b, adjustment may be made for the flame to emerge from the shield 22b.

The processing of the substrate may be accomplished via the combustion gas or direct contact with the flame. Control of these processes is achieved by suitably setting each condition of each process.

In particular, the flame may be set according to conditions so as to have a strongly reductive inner flame (reductive flame) and a strongly oxidative outer flame (oxidative flame), either of which may contact the substrate. Furthermore, the inner flame has a relatively low temperature (approximately 500° C.) and the outer flame has a relatively high temperature (approximately 1400 to 1500° C.). Between the inner flame and outer flame is a high temperature of approximately 1800° C. Therefore, the flame can be set according to the processing conditions.

In the thermal processing step, a reductive atmosphere (hydrogen rich) or oxidative atmosphere (oxygen rich) can be easily set by suitably setting the mixture ratio of hydrogen and oxygen and the amount of gas mixture being supplied.

Since the hydrogen and oxygen of the fuel can be obtained by electrolyzing water, a gas mixture of hydrogen and oxygen having the stoichiometric ratio of 2 mol:1 mol of water ($H_2O$) can be easily obtained, and a reductive atmosphere (hydrogen rich) or oxidative atmosphere (oxygen rich) can be easily obtained by specially adding oxygen or hydrogen to the gas mixture.

The flame temperature is also easily adjustable. The flame condition (temperature, gas pressure and the like) can be adjusted by introducing an inert gas, or adjusting the amount of the source material gas flow as necessary.

A desired temperature profile is easily obtained by adjusting the gas burner nozzle shape and the like.

The process using the gas burner has high mass production characteristics and is inexpensive. The burden on the environment (environmental damage) is reduced since the hydrogen and oxygen providing the source material gas for the flame provide clean energy and the main product is water.

The thermal process which uses the flame of a gas burner as a heat source and a gas mixture of hydrogen and oxygen as a fuel is referred to below as a hydrogen flame process, and the apparatus used in this process is referred to as a hydrogen flame process apparatus.

FIG. 10 is a perspective view showing an example of the structure of the hydrogen flame process apparatus (semiconductor fabricating apparatus) of the present embodiment. Part in common with the apparatus of FIG. 1 are designated by like reference numbers, and further description is omitted.

In FIG. 10, the amorphous silicon 100a on the substrate 100 is converted (recrystallized, crystallized) to polycrystalline silicon 100b by the hydrogen flame process using the linear burner 122. A flame radiates from the linear burner 122 to the substrate 100.

Thus, the present embodiment can cope with a large surface area processing substrate with relative ease by lengthening the linear burner 122.

Figure 11:
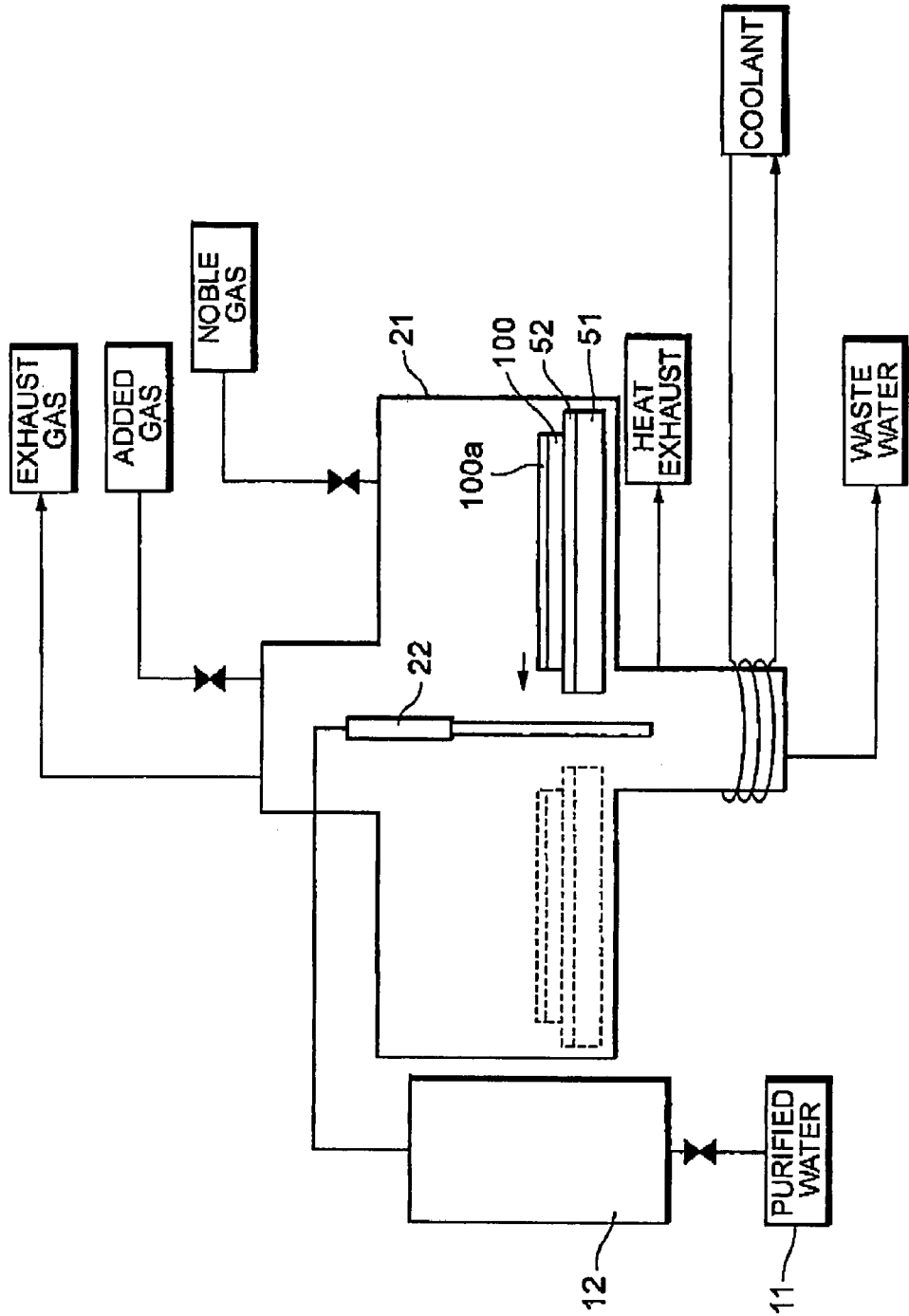
FIG. 11 is a cross section view showing a structural example of the hydrogen flame process device (semiconductor fabricating apparatus)

FIG. 11 is a cross section view showing an example of the structure of the hydrogen flame process apparatus (semiconductor fabricating apparatus) of the present embodiment. Part in common with the apparatus of FIG. 1 are designated by like reference numbers in the apparatus of FIG. 10, and further description is omitted.

In FIG. 11, the amorphous silicon 100a on the substrate 100 is converted to polycrystalline silicon by the hydrogen flame process using the gas burner 22. That is, the flame of the gas burner 22 performs by moving the stage 51 in the arrow direction. The dashed lines in the figure represent the position of the stage 51 and the like after the process.

In addition to the electrolysis tank 12 for supplying hydrogen to the chamber (gas burner 22) 21, this apparatus is provided with a noble gas or nitrogen supplying unit for adjusting the gas pressure within the chamber 21 by adjusting the supplied constituent ratio of the oxygen and hydrogen, and is provided with a gas discharge unit for discharging the gas within the chamber 21 and a water discharge unit (waste water unit) for discharging the product. The flame radiation region is a concavity at the periphery of which coolant is introduced as a cooling unit to prevent the outer wall of the chamber and the interior of the chamber from excessive temperature increase.

Hydrogen is an extremely dangerous gas which has a flammable limit concentration of 4 to 75% under 1 atm at a temperature of 20° C. and atmospheric pressure. Therefore, the structure and processing step are important in preventing explosion. In this apparatus, for example, backfire is prevented because the hydrogen and oxygen are generated separately, and individually introduced into the apparatus. Backfire is a concern following the oxygen introduction unit. Thus, backfire can be prevented by mixing the hydrogen and oxygen within the gas burner or directly before the gas burner. The gases may also be mixed near the tip (muzzle) within the gas burner. It is desirable that a relief valve or the like is installed in the pipeline to the gas burner.

Thus, the surface of the substrate can be heated to a high temperature by increasing the scanning speed so as to recrystallize the silicon and reduce the thermal load on the entire substrate in the present embodiment (the hydrogen flame process apparatus shown in FIGS. 1, 10 and 11, and the process used in this apparatus). For example, the thermal load on the substrate can be reduced compared to conventional ETA. Therefore, warping and cracking caused by heating the substrate can also be reduced.

Figure 12:
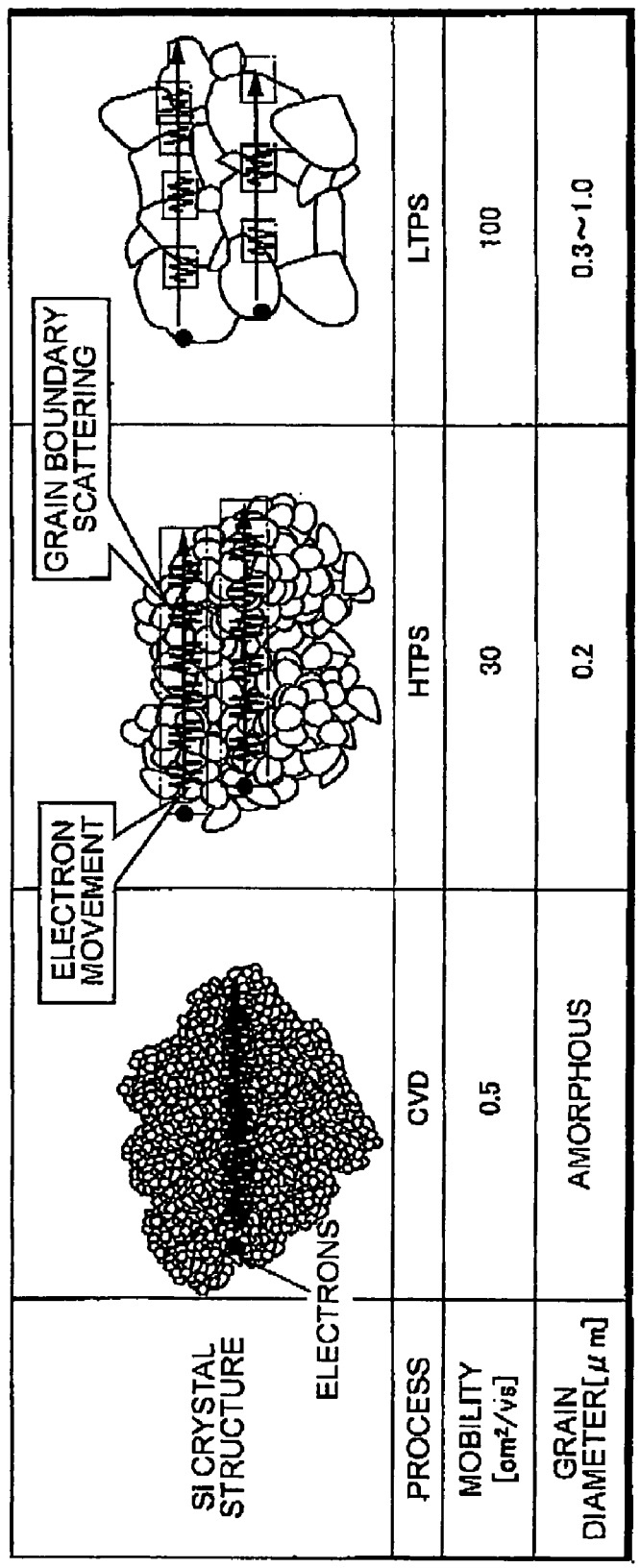
FIG. 12 shows the relationship between the silicon crystal condition and electron mobility.

Furthermore, the surface temperature of the substrate may also be set lower by conventional laser annealing methods. The temperature of the irradiated part becomes 1000° C. or higher by laser annealing. Therefore, melt recrystallization (melting crystal regrowth, melt recrystallization) occurs, maximum crystal particle diameter increases, and dispersion increases, as previously mentioned. FIG. 12 shows the relationship between the silicon crystal condition and electron mobility. As shown in the figure, the condition of the amorphous silicon includes a very low electron mobility of 0.5 cm$^2$/Vs. In contrast, the solid phase recrystallization (solid phase epitaxy, solid phase epitaxial regrowth) in high temperature processes (HTPS) such as RTA produce a crystal particle size (grain size) of 0.2 μm and electron mobility increases to approximately 30 cm$^2$/Vs. Furthermore, low temperature processes (LTPS) such as laser annealing produce melt recrystallization as described above, in which the crystal particle size (grain size) increases to above 0.3 to 1.0 μm, and electron mobility increases to approximately 100 cm$^2$/Vs. As shown in the figure, it is difficult to obtain uniform electron mobility characteristics for each element due to the dispersion in crystal grain size. The black circles in the figure represent electrons, and the arrows represent the direction of electron movement. The waves in the movement path represent the grain boundary dispersion.

In contrast, the present embodiment allows the surface temperature of the substrate to be easily adjusted by adjusting the distance between the flame and the substrate, the amount of gas supplied, and the flame scanning speed. Thus, the dispersion of crystal grain size can be suppressed by solid phase recrystallization. Solid phase recrystallization is believed to start when the substrate surface temperature is between 650 to 900° C. Melt recrystallization is believed to start when the substrate surface temperature is 1,000° C. or higher.

Figure 13:
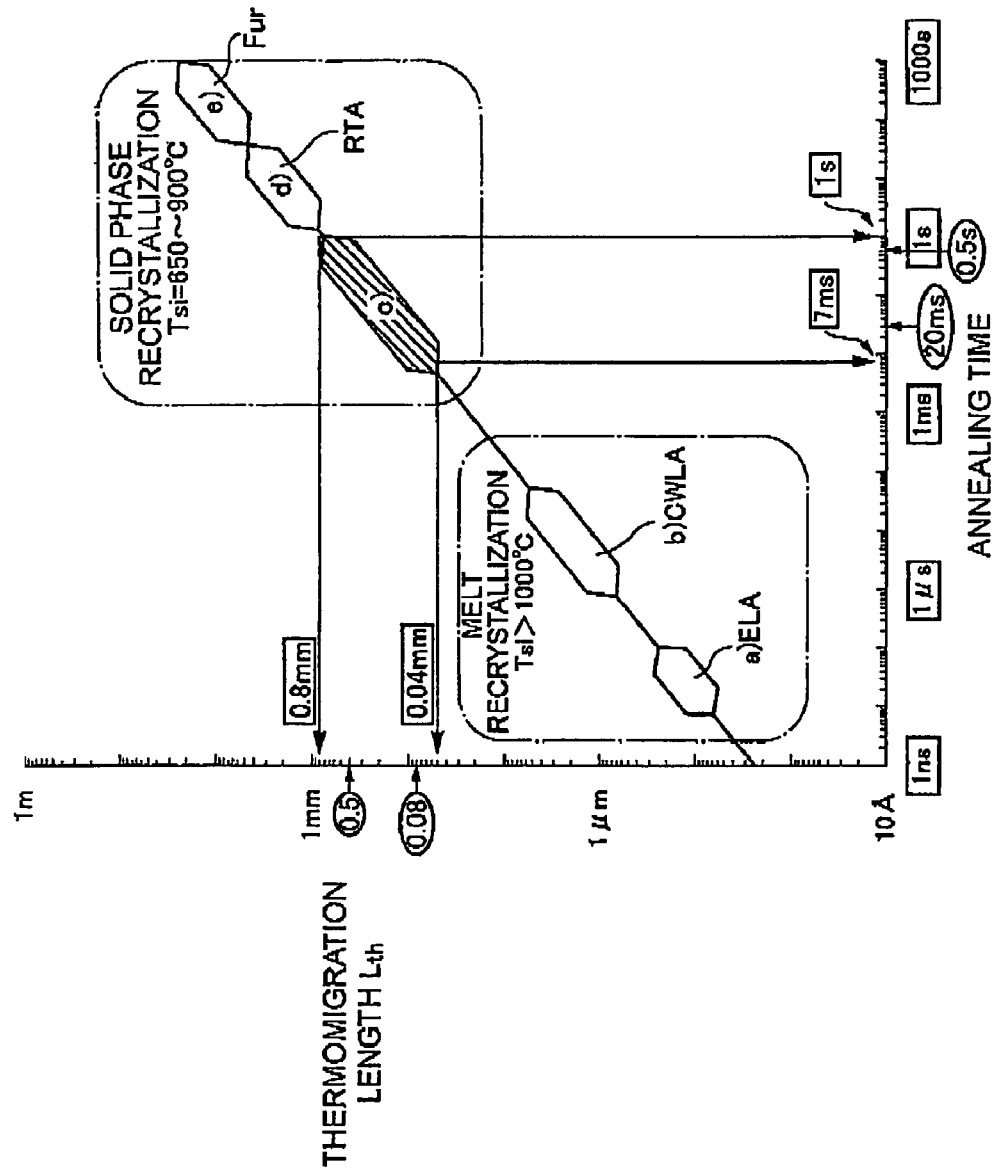
FIG. 13 is a graph showing the relationship between annealing time (seconds) and thermal diffusion length Lth (meters) in each processing method.

FIG. 13 is a graph showing the relationship between thermal diffusion length Lth (m) and annealing time (s) in each type of processing. The thermal diffusion length Lth can be expressed as $(a \times \tau)^{1/2}$. In this case, a represents the thermal diffusion rate (0A-10 glass substrate), and τ represents annealing time (pulse width). In the RTA method, the annealing time is 1 to 10 seconds, and the thermal diffusion length is 1 to sever millimeters (specifically, 0.8 to 3.2 mm), (refer to graph d). In the laser annealing method, the annealing time is 1 to 100 μs and the thermal diffusion length is 0.2 μm to several microns when a CW laser is used, and the annealing time is 10 to several hundred nanoseconds and the thermal diffusion length is several tens to several hundred nanometers when an excimer laser (EL) is used (refer to graphs a and b). Graph e represents the case of a furnace. Here, the term furnace indicates the thermal processing takes place in a furnace. In this case, the annealing time is several hundred seconds or more, and the thermal diffusion length is 10 mm or more.

In the hydrogen flame process of the present embodiment: (1) solid phase recrystallization can occur at a substrate surface temperature of 670 to 750° C. (2) By setting the substrate scanning speed at 0.01 to 1.5 m/s (annealing time: 1 to 0.0067 s), (3) thermal diffusion length can be suppressed to 0.8 to 0.04 mm (refer to graph c). Thus, thermal processing within these ranges accomplishes recrystallization of the silicon film by solid phase recrystallization with the substrate bulk temperature at or below 600° C. As a result, not only expensive silicon glass with high heat resistance, but also inexpensive glass with low heat resistance can be used as the substrate material.

of course, processing at higher temperature (for example, near RTA) can be conducted by increasing the annealing time, that is, performing controls such as reducing the substrate scanning speed or adjusting the distance (gap) between the substrate and the tip of the gas burner. Furthermore, it is also possible in principle to reduce the substrate surface temperature in the laser annealing method by reducing the irradiation time (increasing the laser scanning speed). In this case, however, the scanning speed would be $3 \times 10^4$ mm/s to $3 \times 10^7$ mm/s, and it is impossible to scan the substrate or laser light at such a high speed considering the investigation by the present inventors. In contrast, it is possible to scan the burner or the substrate within a realizable speed range using the hydrogen flame process of the present embodiment.

The hydrogen flame process is capable of practical thermal processing not only in the range shown in graph c of FIG. 13, but also in the range (c through e in FIG. 13) of an annealing time of 0.6 to several hundred seconds or more, and thermal diffusion length of 0.08 mm to several tens of millimeters. In this case, solid phase recrystallization of the silicon film starts at a substrate temperature of approximately 650 to 9000° C. Therefore, the dispersion in grain size is reduced as previously mentioned, and the characteristics of semiconductor elements such as TFT (thin film transistor) and the like can be improved. Although soda glass can not be used as a substrate material, the thermal load can be reduced on silica substrates, and warping and cracking of the substrate can be reduced. That is, the thermal load on the entire substrate (bulk) can be reduced in the hydrogen flame process because heat is applied near the surface of the substrate for only a short time. Therefore, the thermal load is reduced and TFT characteristics are improved regardless of the substrate material.

In view of the above, desirable conditions are described below. In the following description, the phrase a to b means a or more, but not more than b.

The scanning of the substrate is desirably 0.01 m/s or more but not more than 1.5 m/s. In this case the annealing time (irradiation time) is 1 to 0.0067 seconds. The substrate scanning speed is even more desirably 0.02 m/s or more but not more than 0.5 m/s. In this case, the annealing time is 0.5 to 0.02 seconds. The annealing time is the irradiation time per single spot length (flame irradiation surface area). For example, a single spot length is 10 mm. Therefore, the annealing time equals the single spot length divided by the scanning speed. The thermal diffusion length on the substrate is desirably 0.8 to 0.04 mm. The thermal diffusion length is even more desirably 0.5 to 0.08 mm. These conditions suppress the bulk temperature of the substrate, and reduce the thermal load on the substrate. For example, the substrate bulk temperature can be suppressed to approximately 670 to 750° C. In this case, a substrate with low heat resistance can be used.

When the thickness of the glass substrate is 1.1 mm, the thermal diffusion length is 0.8 mm, that is, approximately 73% of the glass substrate thickness. Furthermore, a thermal diffusion length of 0.4 mm is approximately 37% of the glass substrate thickness. Therefore, a thermal diffusion length 75% or less of the thickness of the glass substrate is desirable. A thermal diffusion length 40% or less of the thickness of the glass substrate is even more desirable.

Therefore, the thermal load on the substrate can be reduced in the present embodiment by increasing the scanning speed. Moreover, a temperature range can be selected for solid phase recrystallization that produces scant dispersion of crystal grain size. Accordingly, element dispersion can also be reduced.

Figure 14:
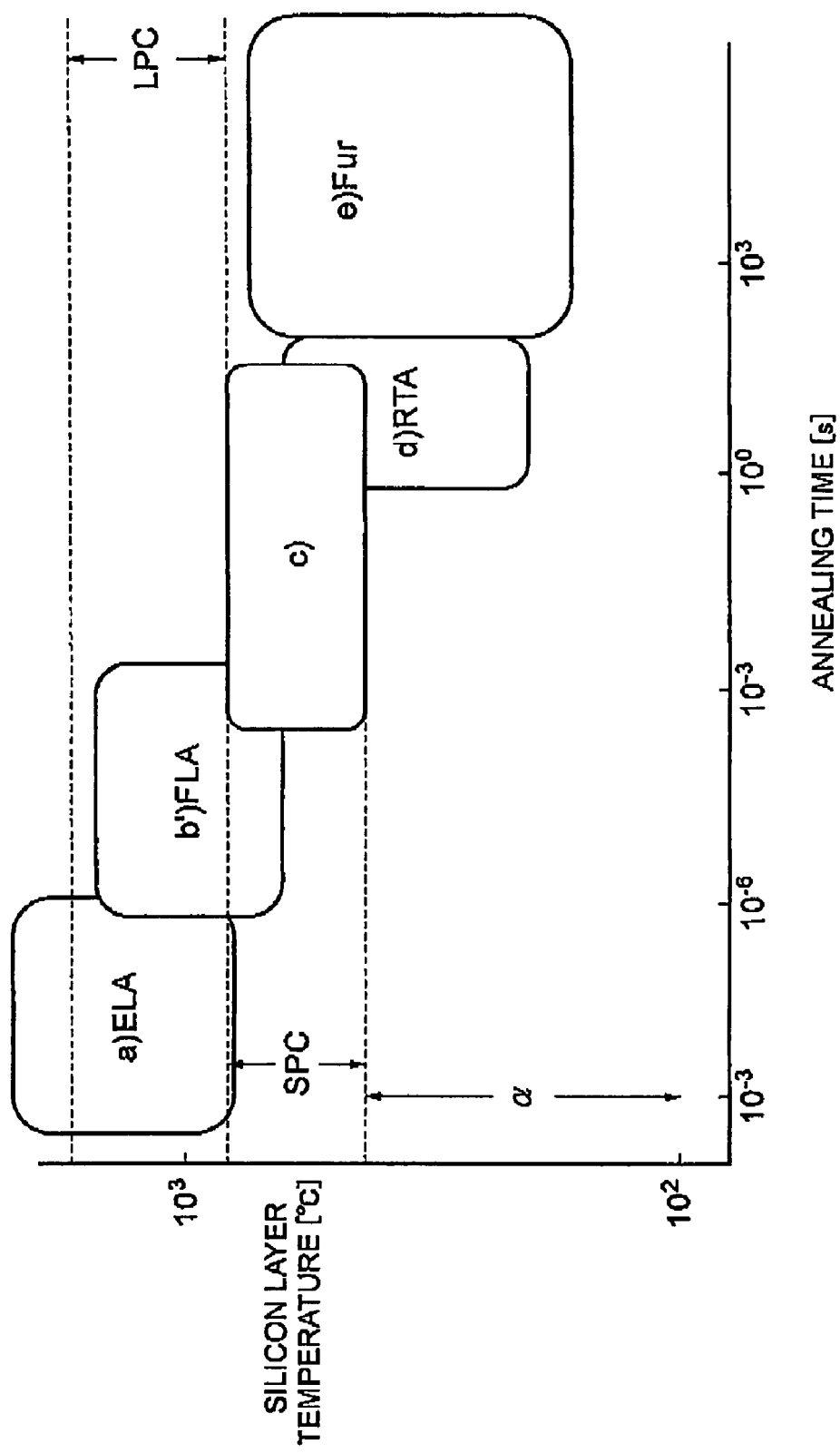
FIG. 14 shows the relationship between annealing time (seconds) and silicon film temperature (° C.)

Although the description in FIG. 13 concerns thermomigration on the substrate, the relationship between silicon film temperature (° C.) and annealing time (seconds) is shown in FIG. 14. As shown in the figure, solid phase recrystallization (SPC) is possible at realizable annealing time of $10^{-2}$ to $10^0$ seconds. Of course, solid phase recrystallization may also occur when the annealing time is $10^0$ seconds or more (that is, the range of RTA and Fur). LPC in the figure represents the melt recrystallization range. FLA indicates flash ramp annealing, and α represents the temperature range of the amorphous or unchanging state.

The semiconductor fabricating apparatus of the present embodiment can itself be fabricated relatively inexpensively, and the apparatus reduces running costs. The scale of the apparatus can easily be increased to process a substrate with a large surface area at once. According to the investigations of the present inventors, the initial cost is reduced 30% and the running cost is also reduced 30% compared to conventional RTA apparatuses. The operating rate is also calculated as improving 10% since the maintenance time for parts replacement and the like is reduced. Throughput is also improved, according to calculations. Initial cost is reduced 50% and running cost is reduced 70% by calculation compared to conventional laser annealing apparatuses.

2) Method for Fabricating a Semiconductor Device

The method for fabricating a semiconductor device (TFT) using the previously mentioned hydrogen flame processing apparatus (semiconductor fabricating apparatus) is described below with reference to FIGS. 15 and 16. FIGS. 15 and 16 are cross section views showing the method for fabricating the semiconductor device (TFT) of the present embodiment.

Figure 15A:
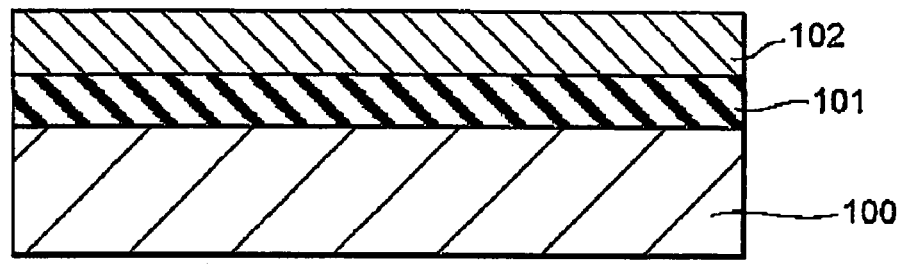
FIG. 15 is a cross section view of the method for fabricating the semiconductor device (TFT) of the embodiment.

As shown in FIG. 15A, an undercoat protective film (undercoat oxide film, undercoat insulating film) 101 of, for example, silicon oxide film, is first formed at a thickness of approximately 100 nm on a glass substrate (silica substrate, substrate, transparent substrate, insulating substrate) 100. The silicon oxide film is formed using, for example, plasma CVD (chemical vapor deposition) with TEOS (tetra ethyl ortho silicate) and oxygen gas as the source materials. The substrate used may be a silicon substrate.

Then, a silicon film (silicon layer) 102, for example, is formed as a semiconductor film (semiconductor layer) on the undercoat protective film 101. The silicon film is formed, for example, by CVD using $SiH_4$ (monosilane) gas. The silicon film is, for example, in an amorphous state.

Figure 15B:
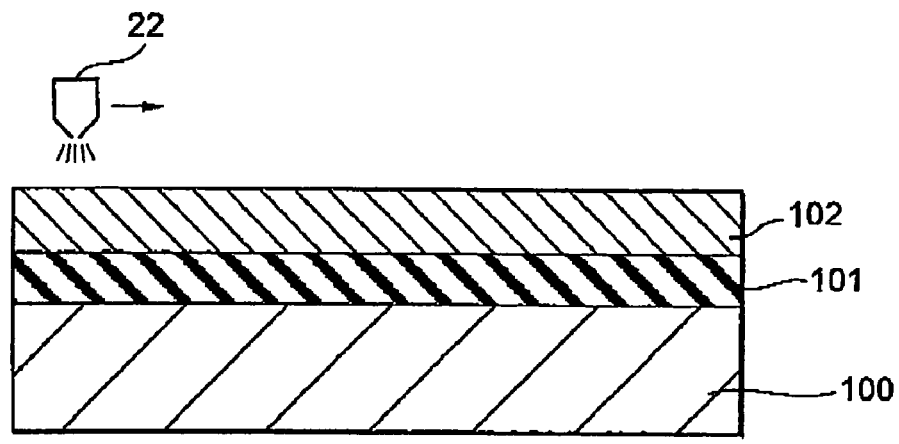

Next, the substrate 100 is loaded on the stage 51 of the semiconductor fabricating apparatus shown in FIG. 1 and the like, and subjected to thermal processing (flame annealing) by having the gas burner 22 scan over the substrate 100 (silicon film 102) to recrystallize the silicon film (hydrogen flame process 1), as shown in FIG. 15B. That is, polycrystallize the silicon film. A polycrystal is a state in which a crystal grains configuring a monocrystal are formed in plurality. The ratio of the hydrogen gas ($H_2$) and oxygen gas ($O_2$) supplied to the gas burner 22 is set at, for example, a stoichiometric composition of 2 mol:1 mol.

In the present embodiment, the thermal load on the substrate 100 can be reduced and warping and cracking of the glass substrate can be reduced by performing thermal processing under the previously described conditions. Recrystallization can also be accomplished by solid phase recrystallization, and dispersion of crystal grain size can be reduced. Thus, TFT characteristics are improved. In this step, processing can be accomplished in a short time even when processing a large substrate, thus improving TFT throughput. In this step, the cost of the apparatus itself as well as the apparatus running cost is reduced.

At this time the surface of the silicon film 102 is oxidized to form a silicon oxide film. The silicon oxide film may also be used as a gate oxide film which is described later. The hydrogen flame process may also be performed on a silicon film 102 through a cap film by forming a cap film (protective film, cover film) on the silicon film 102 beforehand to prevent soiling of the silicon film 102. A silicon oxide film such as a TEOS film, silicon nitride film and the like may be used as the cap film.

After the recrystallization process (hydrogen flame process 1), a hydrogen flame process may also be performed using a hydrogen rich gas mixture (hydrogen flame process 2). That is, the hydrogen or hydrogen radical in the flame may be increased by increasing the ratio of the hydrogen gas ($H_2$) and oxygen gas ($O_2$) in the supplied gas, in other words, increasing the constituent ratio of hydrogen to be greater than the stoichiometric constituent ratio 2 mol:1 mol of water ($H_2O$). Dangling bonds which are charge traps are reduced and TFT carrier nobility is improved when the excess hydrogen couples to the dangling bonds of the silicon. Thus, TFT characteristics are further improved by repairing defects in the silicon crystals via the excess hydrogen. The hydrogen flame process 2 may also be a consecutive process and need not be a separate process from the recrystallization process (hydrogen flame process 1).

Figure 15C:
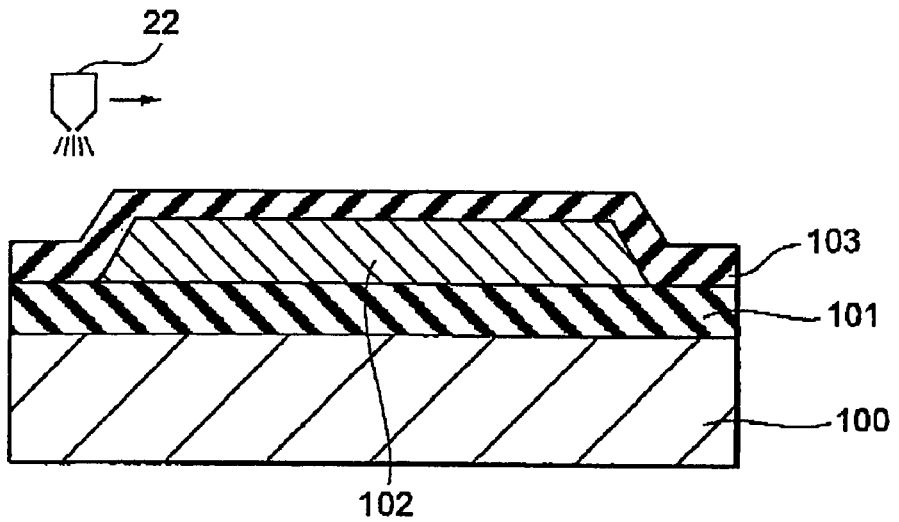

As shown in FIG. 15C, the oxide film is then removed from the surface of the silicon film 102, and after the silicon film is patterned in a desired shape, a silicon oxide film is formed by, for example, CVD, as a gate oxide film (gate insulating film) 103 on the silicon film. A hydrogen flame process may also be performed using an oxygen rich gas mixture to repair the defects in the silicon oxide film with the oxygen (or oxygen radicals) (hydrogen flame process 3). That is, the oxygen or oxygen radicals in the flame may be increased by increasing the ratio of the hydrogen gas ($H_2$) and oxygen gas ($O_2$) in the supplied gas, in other words, increasing the constituent ratio of oxygen to be greater than the stoichiometric constituent ratio 2 mol:1 mol of water ($H_2O$). The excess oxygen and the like couple with the crystal defects in the silicon oxide film, and with the crystal defects present at the interface between the silicon oxide film and the silicon film 102. As a result, the quality of the silicon oxide film is improved, the interface level of the silicon oxide film is reduced, and TFT characteristics are improved.

Figure 16A:
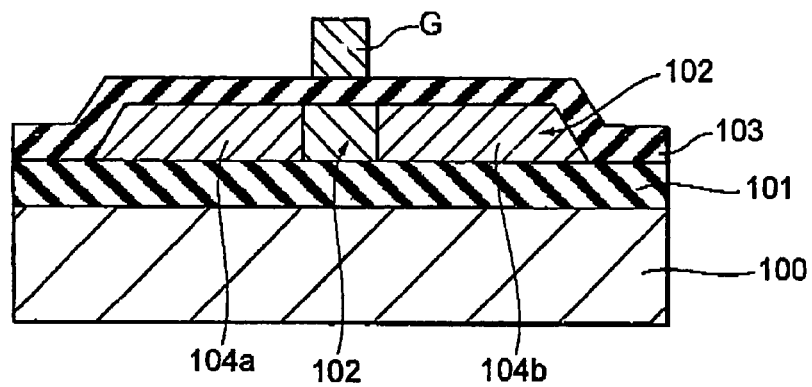
FIG. 16 is a cross section view of the method for fabricating the semiconductor device (TFT) of the embodiment.

As shown in FIG. 16A, a metal material such as aluminum (Al) or the like is then formed as a conductive film on the gate oxide film 103 by, for example, a spattering method. Next, the conductive film is patterned to a desired shape, and a gate electrode (gate electrode lead) G is formed. Rather than Al, a high melting point metal such as Ta (tantalum) may also be used as the conductive film.

Then, with the gate electrode G as a mask, and ionic impurities are injected into the silicon film 102 (doped), and thereafter thermomigration is performed to form source and drain regions 104a and 104b. Either of the regions 104a and 104b may be the source region and the other the drain region. Moreover, $PH_3$ (phosphine), for example, may be injected when the ionic impurities form an n-type semiconductor film, and $B_2H_6$ (diborane), for example, may be injected when the ionic impurity forms a p-type semiconductor film.

Thermal processing for activating the impurities may also be accomplished by a hydrogen flame process (hydrogen flame process 4). That is, the impurities can be activated by a hydrogen flame on the source and drain regions 104a and 104b. A hydrogen flame process may also be performed using an oxygen rich gas mixture (hydrogen flame process 5). This process can repair defects occurring in the gate oxide film 103 by ionic impurity injection and thermomigration. When performing this process, the prior oxygen defect repair step (hydrogen flame process 3) may also be omitted. Defect repair of the gate oxide film by ionic impurity injection and thermomigration (hydrogen flame processes 4 and 5) may also be performed simultaneously by an oxygen rich hydrogen flame process. In these hydrogen flame processes, a protective film such as silicon oxide film or the like may be formed on the gate electrode G and the hydrogen flame process performed through this protective film so as to not add to the thermal load on the gate electrode G. Furthermore, an interlayer insulating film 105 which is described later may be formed, and the hydrogen flame process then may be performed thereafter through this film.

Figure 16B:
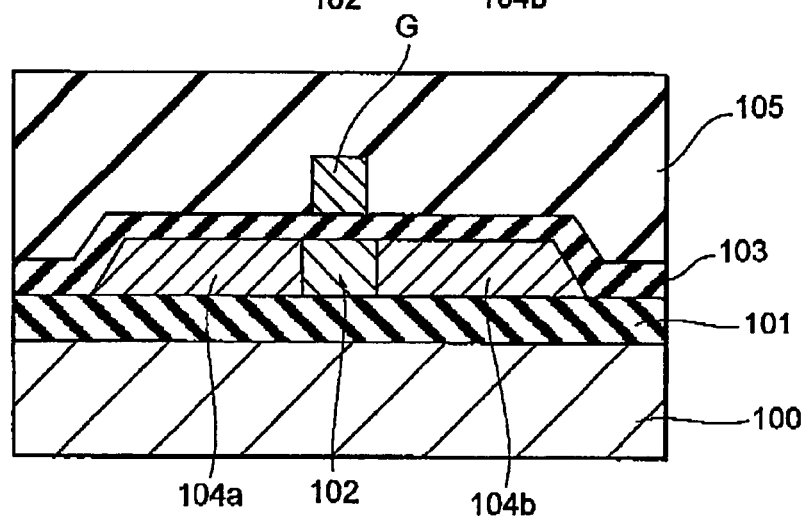

Then, a TEOS film, for example, is formed as an interlayer insulating film 105 on the gate electrode G, as shown in FIG. 16B.

Figure 16C:
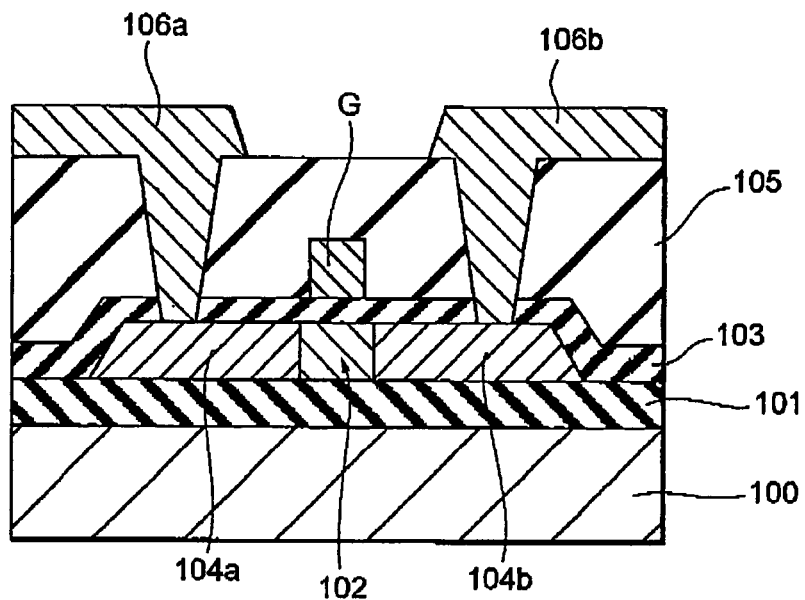

Next, contact holes are formed on the source and drain regions 104a and 104b by patterning the interlayer insulating film 105, as shown in FIG. 16C.

Thereafter, for example, ITO (indium-tin oxide) is formed as a conductive film 106 by a spattering method on the interlayer insulating film 105 which incorporates the internal contact holes. Rather than ITO, a metal material such as, for example, Al, Mo (molybdenum), Cu (copper) or the like may be used as the conductive film 106. Then, the conductive film 106 is patterned in a desired shape, and source and drain electrodes (source and drain extractor electrodes, extractor leads) 106a and 106b are formed. Either of the electrodes 106a and 106b may be the source electrode and the other the drain electrode.

The TFT is completed in this step.

Although the silicon film 102 is patterned after recrystallization in the present embodiment, the silicon film 102 may also be recrystallized after patterning.

Although TFT is used as an example in the present embodiment, the element is not limited to TFT, inasmuch as the hydrogen flame process (apparatus) is also widely applicable to methods for fabricating semiconductor devices that require recrystallization of a semiconductor film such as a silicon film or the like.

Although solid phase recrystallization of a silicon film is used by way of example in the present embodiment, the hydrogen flame process and apparatus may also be used in melt recrystallization of a silicon film. For example, although solid phase growth is desirable to obtain uniform the characteristics in the TFT and the like used in display devices because of the scant dispersion of crystal grain size in a wide range of silicon films (semiconductor films), there are also desirable elements formed by melt recrystallization. Melt recrystallization may be adapted to, for example, elements require high speed operation. In this case, melt recrystallization is possible by setting the various conditions to increase the temperature of the substrate.

3) Experimental Results

The method for improving crystal characteristics based on specific experimental results is described below.

Figure 17:
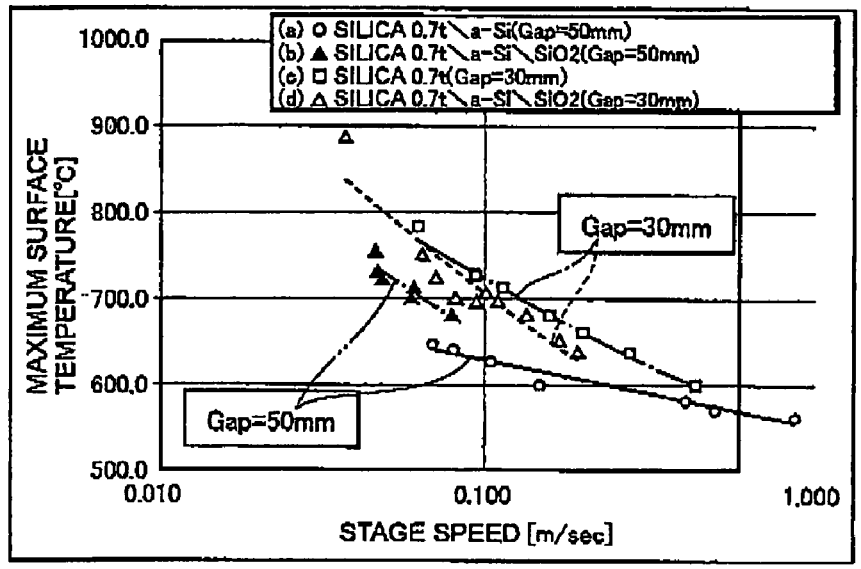
FIG. 17 shows the relationship between the stage speed (m/sec) and the maximum temperature of the substrate surface (° C.)

FIG. 17 shows the relationship between the stage speed (m/sec) and the maximum temperature of the substrate surface (° C.). In the figure, (a) represents when amorphous silicon is deposited on a silica substrate and the hydrogen flame process is performed with the distance (gap) between the substrate and the tip of the gas burner set at 50 mm; (b) represents when a silicon oxide film is deposited on the amorphous silicon on a silica substrate and the hydrogen flame process is performed with the distance (gap) of the gas burner set at 50 mm; (c) represents when amorphous silicon is deposited on a silica substrate and the hydrogen flame process is performed with a gap of 30 mm; (d) represents when a silicon oxide film is deposited on the amorphous silicon on a silica substrate and the hydrogen flame process is performed with a gap of 30 mm.

The processes (a) through (d) confirmed that a substrate temperature of 670° or higher is required for silicon crystallization (recrystallization) in all cases, and it was further confirmed that silicon can be crystallized by these processes, as shown in the figure. It can be understood from FIG. 17 that a maximum substrate surface temperature of 670 to 900° C. was confirmed by a scanning speed of 0.03 m/s or higher but not more than 0.13 m/s.

A tendency for the substrate surface temperature to increase was observed when the gap was small, or the stage speed (flame scanning speed) was slow.

Figure 18:
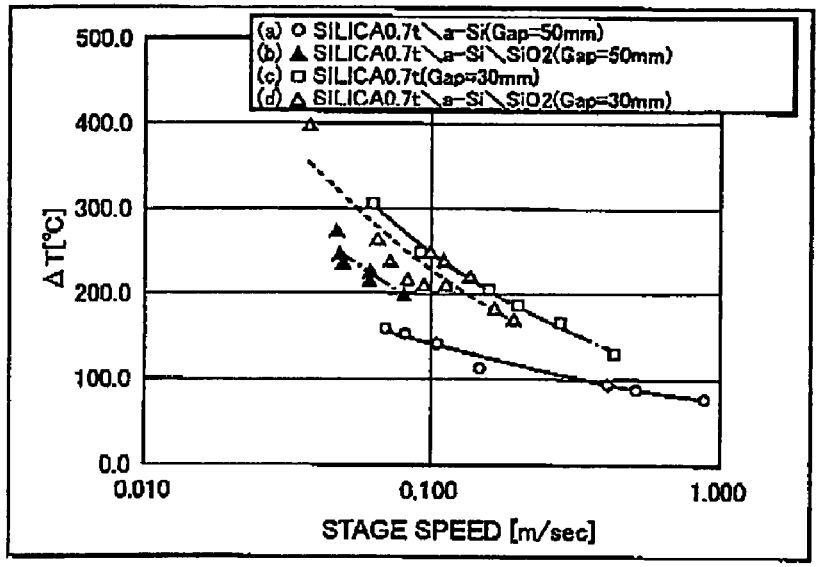
FIG. 18 is a graph showing the relationship between the stage speed (m/sec) and the substrate temperature rise $\Delta T$ (° C.)

FIG. 18 is a graph showing the relationship between the stage speed (m/sec) and the substrate temperature rise $\Delta T$ (° C.). The process parameters (a) through (d) are identical to those of FIG. 17, and the vertical axis of FIG. 17 is set as the substrate temperature rise $\Delta T$ (° C.). A tendency for the substrate temperature rise to increase was also observed win FIG. 18 when the gap was small, or the stage speed (flame scanning speed) was slow.

Five samples A through E were subjected to the hydrogen flame process under various conditions, and the and the silicon film thickness after recrystallization, the silicon oxide film thickness, and crystallization rates were measured The results are shown in FIG. 19. The crystallization rate is the percentage (volume ratio) crystal phase within the silicon film.

Figure 20A:
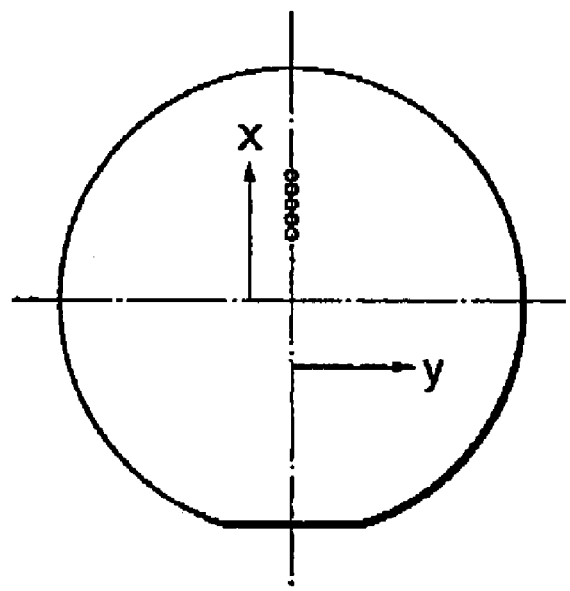
FIG. 20 shows the hydrogen flame process and measurement position.
Figure 20B:
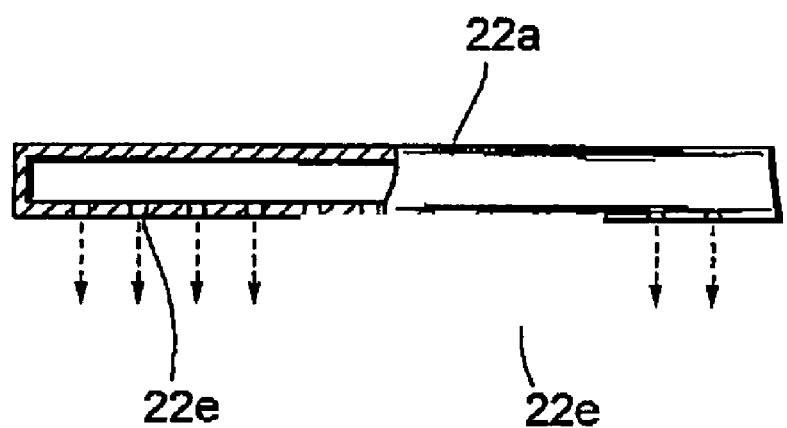

After the hydrogen flame process was performed under the conditions described below, each sample was set at measurement positions at spacing of 0.3 mm and 30 mm in the x direction shown in FIG. 20A, and the crystallization rate and the like were measured at this point. The hydrogen flame process (thermal process, recrystallization process) shown in FIG. 20B was performed by scanning in the y direction shown in FIG. 20A with a flame radiating from a guide tube 22*a* provided with a plurality of hole-like gas outlets 22*e*. FIG. 20 shows the hydrogen flame process and measurement position.

Sample A was processed with the gap set at 50 mm and the scanning speed at 62 mm/s; sample B at a gap of 50 mm and scanning speed of 50 mm/s; sample C at a gap of 30 mm and scanning speed of 98 mm/s; sample D at a gap of 30 mm and scanning speed of 65 mm/s; sample E at a gap of 30 mm and scanning speed of 38 mm/s.

As shown in FIG. 19, the substrate temperature was highest in sample E at 889° C. The thickness of the silicon film was approximately 0.051 μm in samples A through D, and the thickness of the silicon oxide film on the surface was approximately 0.004 μm. The silicon oxide film was formed by the silicon film reacting with the oxygen in the air or oxygen in the flame. The crystallization rate was approximately 0.87 to 0.89 in samples A through D. Excellent crystals were obtained in sample E which had the highest crystallization rate at approximately 0.94 (94%). In this case, the silicon film was approximately 0.04 μm thick, and the silicon oxide film was approximately 0.009 μm thick. The degree of oxidation of the surface of the silicon film was greater in sample E than in other samples.

The data reveal that a high substrate surface temperature is obtained and the crystallization rate is improved by reducing the gap and scanning relatively slowly.

A gap of less than 50 mm is desirable. In sample D (gap 30 mm) which had a gap of less than 50 mm, a relatively good numeric value for the crystallization rate was obtained at 0.89. It is believed in this case, for example, that it is desirable to set the distance between the gas burner and the substrate at 30% or less of the length of the flame to have a flame length from the burner muzzle (the distal end of the burner) of approximately 15 cm.

A flame scanning speed of 40 mm/s or less is desirable. Under this condition, a crystallization rate of 90% or higher is possible.

FIG. 19 shows the half width (FWHM) (cm$^{-1}$) of Raman scattering spectrochemical analysis results of the silicon films of samples A through E.

Since Raman scattering spectroscopy evaluates crystal characteristics by the scattered light spectrum of light impinging a crystal, crystal characteristics are good to the degree of sharpness (small half width) of the scattered light spectrum. As shown in the figure, the relative half width is large in samples A through D, making it difficult to obtain excellent crystal characteristics. In contrast, the half width is narrow in sample E, from which good crystal characteristics can be understood.

FIG. 19 also shows the peak center (cm$^{-1}$) of the Raman spectrochemical analysis results of the silicon films of samples A through E. The peak center indicates the shift from the peak position of the reflected light relative to the impinging light. In the case of monocrystal silicon, the peak center is 520 cm$^{-1}$, and better crystal characteristics are obtained near this numeric value. It can therefore be understood from these results that it is difficult to obtain excellent crystal characteristics in the samples A through D which have peak centers less than 520. In contrast, the peak center in sample E is near 520, from which good crystal characteristics can be understood. A peak center lower than 520 indicates added tension stress in the crystal lattice. Therefore, the stress is low in sample E and crystal characteristics are better than in the other samples.

Improvement of the crystal characteristics by these conditions can therefore be confirmed by Raman scattering spectrochemical analysis.

Description of Electro-Optic Device and Electronic Device

An electro-optic device and electronic device using the semiconductor device (for example, TFT) formed by the method in the above embodiment are described below.

Figure 21A:
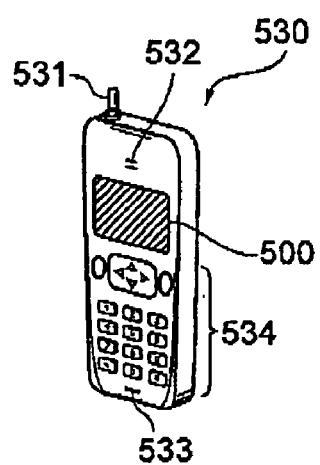
FIG. 21 shows an example of electronic devices using an electro-optic device.
Figure 21B:
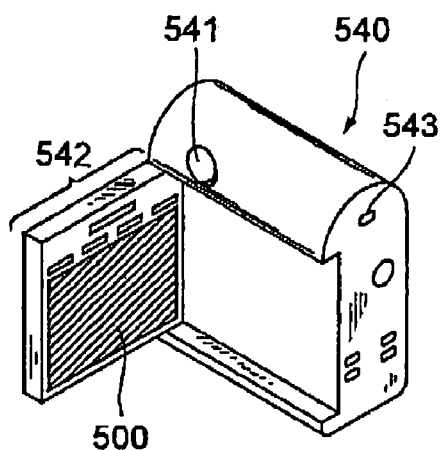
Figure 21C:
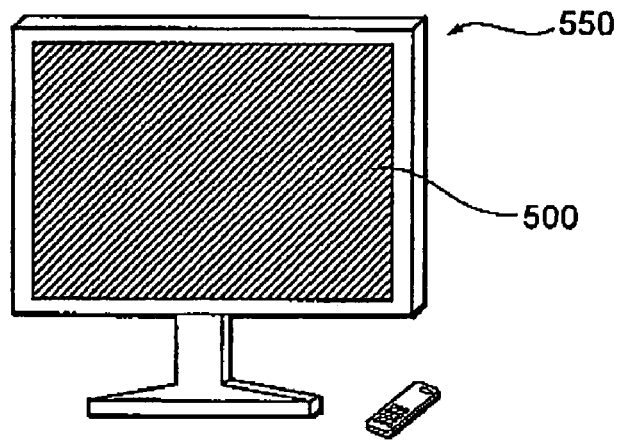
Figure 21D:
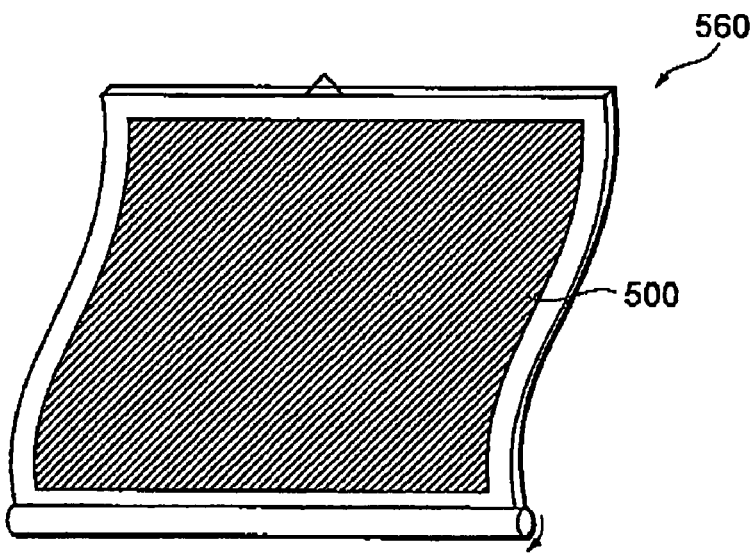

The previously mentioned semiconductor device (TFT, for example) may be used as a drive element of an electro-optic device (display device). FIG. 21 shows an example of electronic devices using the electro-optic device of the present invention. FIG. 21A shows an example of an application to a portable telephone, and FIG. 21B shows an example of an application to a video camera. FIG. 21C shows an example of an application to a television (TV), and FIG. 21D shows an example of an application to a roll-up type television.

As shown in FIG. 21A, a portable telephone 530 is provided with an antenna 531, audio output unit 532, audio input unit 533, operation unit 534, and electro-optic device (display) 500. A semiconductor device formed by the present invention may be used (incorporated) as the electro-optic device.

As shown in FIG. 21B, a video camera 540 is provided with a video receiver 541, operation unit 542, audio input unit 543, and electro-optic device (display) 500. A semiconductor device formed by the present invention may be used (incorporated) as the electro-optic device.

As shown in FIG. 21C, a television 550 is provided with an electro-optic device (display) 500. A semiconductor device formed by the present invention may be used (incorporated) as the electro-optic device. The electro-optic device of the present invention may also be used in a monitor device (electro-optic device) of a personal computer or the like.

As shown in FIG. 21D, a roll-up type television 560 is provided with an electro-optic device (display) 500. A semiconductor device formed by the present invention may be used (incorporated) as the electro-optic device.

The electronic devices having an electro-optic device additionally include large screen, personal computers, portable information devices (so-called PDA, electronic notebook) and the like, facsimile machines with display function, digital camera viewfinders, portable televisions, electrically lighted bulletin boards, advertising displays and the like.

The present invention is not limited to the examples described above inasmuch as the applications and examples described in the embodiments of the present invention may be suitably combined, modified, or improved as necessary.

What is claimed is:

1. A method for fabricating a semiconductor device, comprising:

forming a silicon film having a thickness of 0.051 μm or less on a glass substrate; and recrystallizing the silicon film by causing a flame, as a heat source, of a gas burner that uses a hydrogen and oxygen gas mixture as a fuel to relatively scan the glass substrate, the gas burner including:

(a) a shield defining a combustion compartment and having a nozzle that is spaced from the glass substrate a distance of 0.05 m or less, and (b) a guide tube disposed within the combustion compartment, supplying the fuel to the combustion compartment, and having a plurality of gas flow outlets that emit the fuel into the combustion compartment, wherein the guide tube is movable within the combustion compartment, wherein
the flame of the gas burner scans the glass substrate at a scanning speed of 0.03 m/s or higher but not more than 0.04 m/s so as to keep a thermal diffusion length that is 0.8 to 0.04 mm on the glass substrate during the recrystallization of the silicon film, thereby the recrystallization is accomplished by solid phase recrystallization,
a surface temperature of the glass substrate during the recrystallization is 670 to 750° C., and
the method for fabricating further includes moving the guide tube within the combustion compartment, thereby adjusting a distance between the guide tube and the nozzle.

2. The method for fabricating a semiconductor device according to claim 1, wherein
the flame of the gas burner scans the glass substrate at the scanning speed of 0.038 m/s.

3. The method for fabricating a semiconductor device according to claim 1, wherein
the thermal diffusion length on the glass substrate during the recrystallization is 0.5 to 0.08 mm.

4. The method for fabricating a semiconductor device according to claim 1, wherein
the thermal diffusion length on the glass substrate during the recrystallization is 75% or less of the thickness of the glass substrate.

5. The method for fabricating a semiconductor device according to claim 1, wherein the thermal diffusion length on the glass substrate during the recrystallization is 40% or less of the thickness of the glass substrate.

6. The method for fabricating a semiconductor device according to claim 1, wherein a crystal particle size for the silicon film is less than 0.3 μm.

7. A method for fabricating an electronic device having a semiconductor device, wherein
the method for fabricating an electronic device has the method for fabricating a semiconductor device according to claim 1.

8. The method for fabricating a semiconductor device according to claim 1, wherein
the amount of heat transferred per unit area from the flame through a nozzle outlet varies.

9. The method for fabricating a semiconductor device according to claim 1, wherein the nozzle is spaced from the glass substrate a distance of 0.03 m and the silicon film has a thickness of 0.04 μm.

10. The method for fabricating a semiconductor device according to claim 1, wherein the guide tube is rotatable with respect to the shield and the method for fabricating further includes rotating the guide tube within the combustion compartment so as to adjust a direction in which the gas flow outlets emit the fuel.

11. The method for fabricating a semiconductor device according to claim 10, wherein the nozzle is spaced from the glass substrate a distance of 0.03 m and the silicon film has a thickness of 0.04 μm.

12. The method for fabricating a semiconductor device according to claim 1, wherein the distance the nozzle is spaced from the glass substrate is 30% or less of a length of the flame of the gas burner.

13. The method for fabricating a semiconductor device according to claim 12, wherein the nozzle is spaced from the glass substrate a distance of 0.03 m and the silicon film has a thickness of 0.04 μm.

* * * * *